(12) United States Patent
Grozinger et al.

(10) Patent No.: US 10,015,893 B2
(45) Date of Patent: Jul. 3, 2018

(54) AUTOMATION FIELD DEVICE

(71) Applicant: Endress+Hauser GmbH+Co. KG, Maulburg (DE)

(72) Inventors: Roland Grozinger, Neuenburg (DE); Andreas Kaiser, Todtnau (DE); Dietmar Spanke, Steinen (DE)

(73) Assignee: Endress+Hauser GmbH+Co. KG, Maulburg (DE)

( * ) Notice: Subject to any disclaimer, the term of this patent is extended or adjusted under 35 U.S.C. 154(b) by 0 days.

(21) Appl. No.: 15/427,436

(22) PCT Filed: Aug. 5, 2015

(86) PCT No.: PCT/EP2015/068114
§ 371 (c)(1),
(2) Date: Feb. 8, 2017

(87) PCT Pub. No.: WO2016/020460
PCT Pub. Date: Feb. 11, 2016

(65) Prior Publication Data
US 2017/0188472 A1 Jun. 29, 2017

(30) Foreign Application Priority Data
Aug. 8, 2014 (DE) .......................... 10 2014 111 375

(51) Int. Cl.
*H05K 5/00* (2006.01)
(52) U.S. Cl.
CPC .................................. *H05K 5/0026* (2013.01)
(58) Field of Classification Search
None
See application file for complete search history.

(56) References Cited

U.S. PATENT DOCUMENTS

| 4,347,444 A * | 8/1982 | Taylor ................... H01H 47/18 307/141 |
| 4,468,616 A * | 8/1984 | Yoshizaki .......... G01R 31/2642 324/750.03 |

(Continued)

FOREIGN PATENT DOCUMENTS

| DE | 10 2005 034 664 B3 | 10/2006 | |
| DE | 102005034664 | * 10/2006 | ............. G06F 1/185 |

(Continued)

OTHER PUBLICATIONS

Search Report for German Patent Application No. 10 2014 111 375.6, German Patent Office, dated Jun. 23, 2015, 6 pp.

(Continued)

*Primary Examiner* — Dimary Lopez Cruz
*Assistant Examiner* — Muhammed Azam
(74) *Attorney, Agent, or Firm* — Mark A. Logan; PatServe

(57) ABSTRACT

An automation field device having a housing and a modular field device electronics unit located inside the housing. The electronics unit has a first circuit board having at least one first and one second plug-in connector element, wherein the first plug-in connector element is used to electrically connect a peripheral unit, wherein both the first and the second plug-in connector elements can be contacted essentially from the same preferred plug-in direction, and a second circuit board having at least one third plug-in connector element, wherein the circuit boards are arranged such that the second plug-in connector element is connected to the third plug-in connector element in a detachable manner to electrically connect the peripheral unit to the second circuit board, and the second circuit board has at least one opening, via which the first plug-in connector element of the first circuit board is accessible for connecting the peripheral unit.

12 Claims, 2 Drawing Sheets

(56) References Cited

U.S. PATENT DOCUMENTS

| | | | | |
|---|---|---|---|---|
| 6,577,030 | B2 * | 6/2003 | Tominaga | B62D 5/0406 |
| | | | | 310/64 |
| 7,983,049 | B2 * | 7/2011 | Leifer | H05K 1/141 |
| | | | | 361/728 |
| 9,521,773 | B2 * | 12/2016 | Izumi | H05K 7/12 |
| 2004/0105240 | A1 * | 6/2004 | Haba | G06F 13/409 |
| | | | | 361/752 |
| 2011/0317390 | A1 | 12/2011 | Moser et al. | |
| 2013/0044444 | A1 * | 2/2013 | Creighton | G01J 1/0271 |
| | | | | 361/752 |
| 2017/0188472 | A1 * | 6/2017 | Grozinger | H05K 5/0026 |

FOREIGN PATENT DOCUMENTS

| | | | |
|---|---|---|---|
| DE | 10 2006 028 361 A1 | 9/2007 | |
| DE | 10 2012 108 414 A1 | 3/2014 | |
| DE | 102012108414 * | 3/2014 | ............ H05K 5/069 |
| DE | 10 2014 111 375 A1 | 2/2016 | |
| WO | 2016020460 A1 | 2/2016 | |

OTHER PUBLICATIONS

International Search Report for PCT Application No. PCT/EP2015/068115, WIPO, dated Oct. 19, 2015, 7 pp.

\* cited by examiner

AUTOMATION FIELD DEVICE

CROSS-REFERENCE TO RELATED APPLICATIONS

The present application is related to and claims the priority benefit of PCT Application No. PCT/EP2015/068114, filed on Aug. 5, 2015, and German Patent Application No. 10 2014 111 375.6, filed on Aug. 8, 2014, the entire contents of which are incorporated herein by reference.

TECHNICAL FIELD

The invention relates to a field device in process automation.

BACKGROUND

In automation, field devices serving to capture and/or modify process variables are frequently used, particularly in process automation. Sensors, such as fill-level measuring devices, flow meters, pressure and temperature measuring devices, pH-redox potential meters, conductivity meters, etc., are used for recording the respective process variables, such as fill level, flow, pressure, temperature, pH level, or conductivity. Actuators, such as, for example, valves or pumps, are used to influence process variables, by means of which actuators the flow of a fluid in a pipeline section or the filling level in a container can be altered. Field devices, in general, refer to all devices which are process-oriented and which provide or edit process-relevant information. In the context of the invention, field devices are understood to be, in particular, remote I/O's, wireless adapters, or general devices that are arranged on the field level. A variety of such field devices are manufactured and marketed by the Endress+Hauser company.

A commonality of all the aforementioned field devices is that a measured value is determined and evaluated from the process variables determined by the sensors by means of downstream field device electronics units. These field device electronics units are generally adapted to the relevant measuring requirements and the process variable to be measured, so that independent field device electronics units must be developed for each sensor concept, each process variable to be measured, and each measuring performance. The same holds true, of course, when the field device has an actuator and serves to influence the process variable. Today, functions are encapsulated in individual electronics modules that typically have a plurality of interfaces. When using the field device, one of these interfaces serves to connect to an external unit that is needed for the desired function. The interface thus more or less represents a "customer interface" that can be individually allocated from field device to field device. In addition to the "customer interface," current electronics modules have an internal interface by means of which the function is provided within the field device. Typically, the interfaces are arranged so that the "customer interface" is in front for customer accessibility, and the internal interface is designed to be in back. The disadvantage with this solution is that complicated sealing measures must be performed when potting the printed circuit board in the electronics module housing so that the potting does not run out of the housing.

SUMMARY

The object of the invention is to propose a field device with a functionality that can be easily adapted by a field device electronics unit to correspond to the requirements, and is easier to produce.

This object is achieved according to the invention by an automation field device with a housing and a modular field device electronics unit located within the housing, wherein the field device includes at least the following: a first printed circuit board which has at least one first and one second plug-in connector element, wherein the first and the second plug-in connector elements are designed to transmit energy and/or data so that a complementary plug-in connector element that is also designed to transmit energy and/or data can be plugged in in a preferred plug-in direction, and both plug-in connector elements accordingly form a plug-in connector coupling, wherein the first plug-in connector element serves to electrically connect a peripheral unit, wherein the first and the second plug-in connector elements are arranged on the first printed circuit board such that both the first plug-in connector element and the second plug-in connector element can be contacted essentially from the same preferred plug-in direction, a second printed circuit board which has at least one third plug-in connector element that is designed to transmit energy and/or data and is complementary to the second plug-in connector element, wherein the printed circuit boards are arranged such that the second plug-in connector element is connected to the third plug-in connector element of the second printed circuit board in a detachable manner in order to thereby electrically connect the peripheral unit to the second circuit board with the assistance of the first printed circuit board, and the second printed circuit board has at least one opening, via which the first plug-in connector element of the first printed circuit board is accessible for connecting the peripheral unit.

The object is achieved according to the invention in that the interfaces are not separated between back and front; instead, the two interfaces remain in front. All of the interfaces of the respective printed circuit board therefore face in the same direction and can be contacted in the same preferred plug-in direction, i.e., can be plugged into each other.

The plug-in connector elements are designed so that they can be releasably plugged onto a corresponding, i.e., inversely designed, plug-in connector element. The two inversely designed plug-in connector elements are plugged into each other corresponding to their preferred plug-in direction and are appropriately aligned mechanically by a form fit, and accordingly form a plug-in connector coupling. In this context, the preferred plug-in direction can be understood as a normal vector standing on the end face pointing toward the respective plug-in connector element.

In one advantageous embodiment, the first printed circuit board has a fourth plug-in connector element that is designed to transmit energy and/or data and can be contacted from the same preferred plug-in direction as the first and second plug-in connector elements.

In particular, the embodiment provides that the fourth plug-in connector element be connected via at least one gas-filled tube or gas arrestor to the first plug-in connector element.

In another advantageous embodiment, the second printed circuit board has at least one fifth plug-in connector element that is designed to transmit energy and/or data and is complementary to the fourth plug-in connector element of the first printed circuit board, wherein the fifth plug-in connector element is arranged on the same side of the printed circuit board as the third plug-in connector element of the second printed circuit board, and wherein a variety of, and preferably all, contact pins of the fifth plug-in connector element are connected to ground.

In another advantageous embodiment, the second printed circuit board has additional, third plug-in connector elements that are designed to transmit energy and/or data and are complementary to the second plug-in connector element of the first printed circuit board.

In particular, the embodiment provides that, in the event that additional first printed circuit boards are connected to the second printed circuit board by the additional, third plug-in connector elements, the second printed circuit board has additional openings via which the first plug-in connector elements of the additional first printed circuit boards are accessible for connecting additional peripheral units. Moreover, the embodiment provides that all third plug-in connector elements are connected to each other by an internal bus. Particularly preferably, the embodiment provides that the second plug-in connector element of the first printed circuit board be designed according to a bus specification preferably, a CAN bus specification.

In another advantageous embodiment, the second printed circuit board has additional, fifth plug-in connector elements that are designed to transmit energy and/or data, and wherein a variety of, and preferably all, contact pins of the additional fifth plug-in connector elements are also connected to ground.

In another advantageous embodiment, all of the third plug-in connector elements and all of the fifth plug-in connector elements are arranged in an alternating sequence on the second printed circuit board.

In another advantageous embodiment, the first, second, and fourth plug-in connector elements of the first printed circuit board can be contacted from the same printed circuit board edge or printed circuit board side.

In another advantageous embodiment, the first and second printed circuit board are arranged relative to each other such that the surface plane of the first printed circuit board intersects with the surface plane of the second printed circuit board.

In a final embodiment, the peripheral unit is arranged spatially to the outside of the housing, and at least one opening or passage is provided in the housing through which a lead is guided to the peripheral unit.

BRIEF DESCRIPTION OF THE DRAWINGS

The invention is explained in more detail based upon the following drawings. In the drawings.

DETAILED DESCRIPTION

Figure 1:
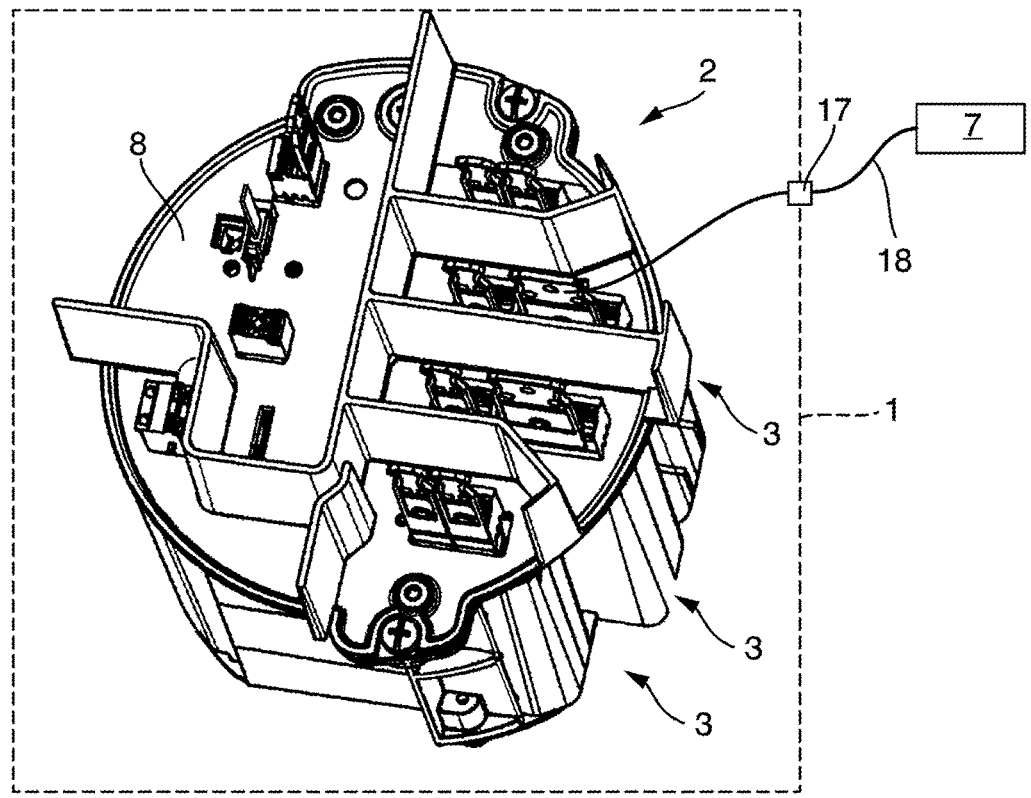
FIG. 1 shows a schematic representation of a field device.

FIG. 1 shows a schematic representation of an automation field device according to the invention. The field device according to the invention is characterized in that the field device electronics unit 2 located within the housing 1 is designed modularly from at least one first printed circuit board 3 and one second printed circuit board 8. Typically, however, the field device electronics unit 2 consists of several first printed circuit boards 3 that are connected to each other by the second printed circuit board 8, which more or less serves as a mainboard. The printed circuit boards 3, 8 are designed such that the second printed circuit board 8, which serves as a main printed circuit board, is in electrical contact with the first printed circuit board 3 by plugging in the at least one first printed circuit board 3, in order to thereby exchange data and/or energy with each other. As already noted, typically, several first printed circuit boards 3 are connected to the second printed circuit board 8 (main printed circuit board), so that the desired function of the field device can be realized by an individually tailored field device electronics unit 2. The modular field device electronics unit 2 accordingly corresponds to the modular principle in which the overall system, i.e., the field device electronics unit 2, is constructed from individual components, i.e., the different printed circuit boards 3, 8.

The field device electronics unit 2 constructed or assembled in this manner is then integrated in the housing 1 of the field the device. The housing 1 of the field device is indicated in FIG. 1 by the dashed line. The housing 1 depicted in FIG. 1 has an opening for a passage 17 by means of which a peripheral unit 7 located outside of the field device housing 1 is, or can be, connected via a lead 18 to the field device electronics unit 2. An alternative design of the field device is also conceivable, however, in which the peripheral unit 7 is located within the housing 1.

In general, peripheral units 7 are units that receive or provide information via an analog or digital interface, wired or wirelessly. Examples include: a PLC that reads out or provides information; a thermocouple that generates analog thermoelectric voltage; a field device that produces a digital signal that, for example, is generated upon reaching a threshold; a field device that produces an analog current signal with or without a digital communication component (HART); a receiving unit for receiving wireless digital signals (wireless HART, etc.).

Figure 2:
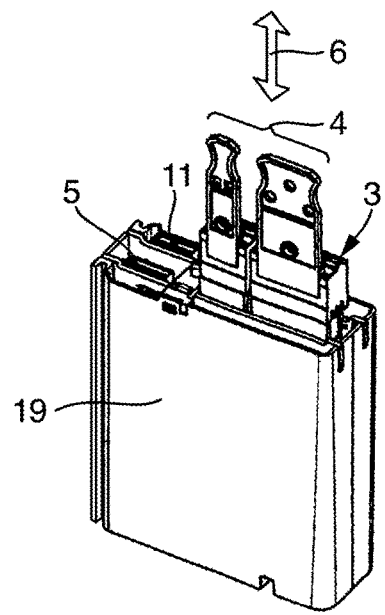
FIG. 2 shows a schematic representation of the first printed circuit board.

FIG. 2 shows a schematic representation of a possible embodiment of the first printed circuit board 3. The first printed circuit board 3 in the present embodiment has first, second, and fourth plug-in connector elements 4, 5, 11 for transmitting data and/or energy. Other embodiments in which the number of available plug-in connector elements deviates from the embodiments shown FIG. 2 are entirely conceivable.

The plug-in connector elements 4, 5, 11 typically have a variety of contact pins. For example, a plug-in connector element can consist of two rows that each includes 12 contact pins, and the plug-in connector element accordingly has a total of 24 contact pins.

The plug-in connector elements 4, 5, 11 are designed so that they can be releasably plugged into corresponding, i.e., inversely designed, plug-in connector elements 9, 13, 15, 16. The two inversely designed plug-in connector elements are plugged into each other corresponding to their preferred plug-in directions and are appropriately aligned mechanically by a form fit, accordingly forming a plug-in connector coupling.

The preferred plug-in direction can be understood as a normal vector standing on the end face pointing toward the respective plug-in connector element. In FIG. 2, the preferred plug-in direction is indicated by the arrow with reference number 6.

According to the invention, all plug-in connector elements 4, 5, 11 that are located on the first printed circuit board are arranged such that they can be contacted essentially from the same preferred plug-in direction 6. For example, as shown in FIG. 2, the plug-in connector elements 4, 5, 11 of the first printed circuit board 3 are thus arranged on or in a printed circuit board edge, and the normal vectors of all plug-in connector elements 4, 5, 11 point in the same direction. It is, accordingly, possible to contact all plug-in connector elements 4, 5, 11 of the first printed circuit board 3 from the preferred plug-in direction 6.

Moreover, the arrangement of all plug-in connector elements 4, 5, 11 along a printed circuit board edge yields the advantage that, when potting the first printed circuit board 3 in a printed circuit board housing 19, this printed circuit board housing 19 requires an opening only in one side, from which all of the plug-in connector elements 4, 5, 11 of the first printed circuit board 3 protrude. With the printed circuit boards known from the prior art, plug-in connector elements are arranged at different printed circuit board edges, and significant additional effort is required when potting to properly seal the printed circuit board in the printed circuit board housing provided with several openings.

The first printed circuit board 3 satisfies a specific function. In the event that several first printed circuit boards 3 are provided, it can be useful for each of the first printed circuit boards 3 to satisfy a different, specific function. The first printed circuit board shown in FIG. 2 serves to electrically connect a peripheral unit 7. To accomplish this, the peripheral unit 7 is releasably connected via a lead 18 to the first plug-in connector element 4. The first printed circuit board 3 accordingly serves to link or connect units that are external, i.e., arranged outside of the housing of the field device 1 as described above, to the internal field device electronics unit 2.

The second plug-in connector 5 of the first printed circuit board 3 serves to electrically connect the first printed circuit board 3 to the second printed circuit board 8. Typically, the second plug-in connector element 5 is designed for this purpose according to a bus specification, such as a CAN bus specification. The internal contact of the first and second printed circuit boards 3, 8 to each other is achieved by the second plug-in connector element 5.

The fourth plug-in connector element 11 of the first printed circuit board 3 also serves, like the other plug-in connector elements 4, 5, to transmit energy and/or data. It can also, like the other plug-in connector elements 4, 5, be contacted from the same preferred plug-in direction 6. The fourth plug-in connector element 11 can be connected via the first printed circuit board 3 by at least one gas-filled tube or gas arrestor (not shown in FIG. 2) to the first plug-in connector 4.

Like all other plug-in connector elements 4, 5, the fourth plug-in connector element 11 is formed from a variety of individual contact pins. Whereas, with the other plug-in connector elements 4, 5, the individual contact pins are individually assigned differently, such as pin 1 to ground, pin 2 to a first data line, pin 3 again to ground, and pin to a second dateline, etc., several contact pins of the fourth plug-in connector element 11 are assigned to ground, in order to discharge current via the first plug-in connector 4, the gas-filled tube or gas arrestor, and then the fourth plug-in connector element 11, in the event of an overvoltage originating from the externally arranged peripheral unit 7. Destruction of the field device electronics unit 2 is prevented by discharging the current via a variety of pins of the fourth plug-in connector element 11 in the event of overvoltage.

Figure 3:
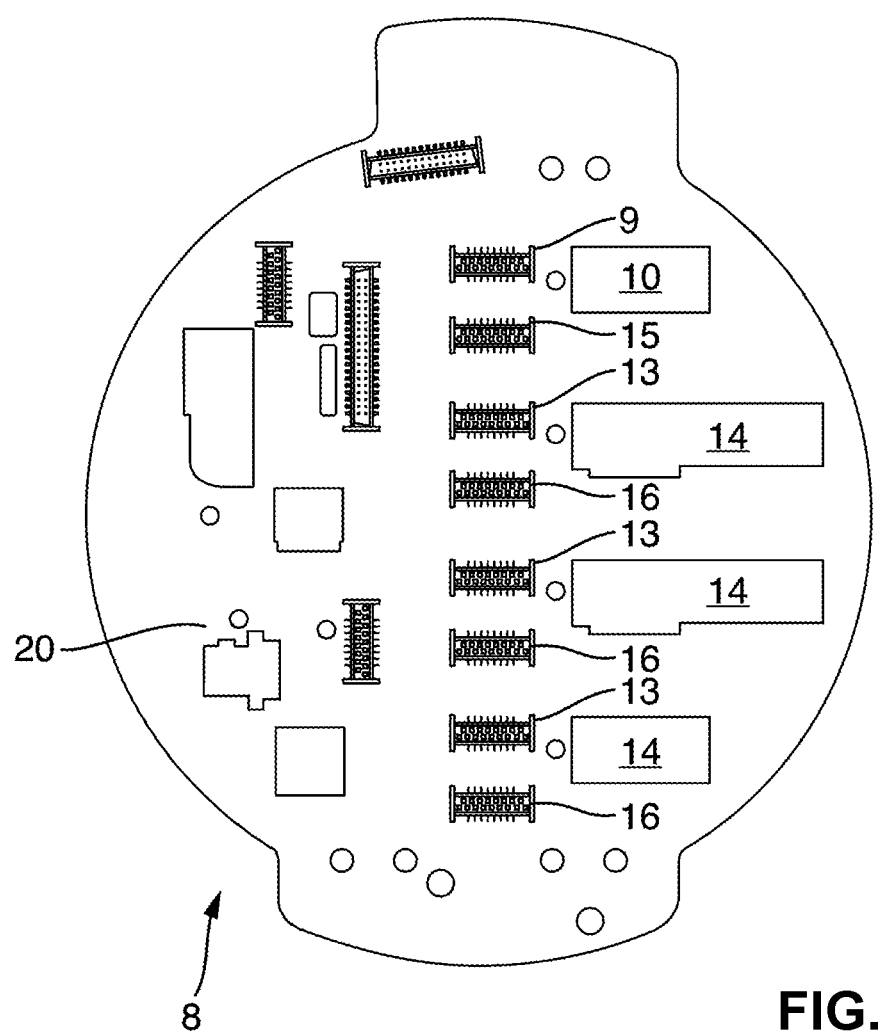
FIG. 3 shows a schematic representation of the second printed circuit board.

FIG. 3 shows a schematic representation of the second printed circuit board 8 that serves as a mainboard of the field device electronics unit 2. The second printed circuit board 8 has at least one third plug-in connector element 9. Typically, additional third plug-in connector elements 13 are available that serve to transmit data and/or current. All third plug-in connector elements 9, 13 are arranged on the second printed circuit board 8 such that they are located on the same, first side 20 of the second printed circuit board 8. Their preferred plug-in directions 6 accordingly extend from the plane of the sheet, or their normal vector stands on the first side of the second printed circuit board 20.

The third plug-in connector elements 9, 13 serve to internally contact the first printed circuit board 3 to the second printed circuit board 8. As already described above, the third plug-in connector elements 9, 13 are complementary, i.e., designed inversely to the first plug-in the connector element 4, so that they can be plugged into each other. At least a part of the third plug-in connector elements 9, 13 are connected to each other on the second printed circuit board 8 by a bus, such as a CAN bus.

The second printed circuit board 8 further has at least one opening 10 through which the first plug-in connector element 4 of the first printed circuit board 3 projects when the first printed circuit board 3 is connected to the second printed circuit board 8, to enable contact of the first plug-in connector element 4. In addition, the second printed circuit board 8 typically has further openings 14 by means of which, in the event that several first printed circuit boards 3 are to be connected to the second printed circuit board 8, the first plug-in connector elements 4 of the first printed circuit boards 3 can be contacted through these openings.

In addition to the third plug-in connector elements 9, 13, the second printed circuit board 8 has at least one fifth plug-in connector element 15 typically, however, several additional fifth plug-in connector elements 16 that are also designed to transmit energy and/or data. The contact pins of the fifth plug-in connector elements 15, 16 are assigned in the same manner as the contact pins of the fourth plug-in connector elements 11, in order to discharge the current in the event of an overvoltage.

The third plug-in connector elements 9, 13 and the fifth plug-in connector elements 15, 16 are arranged on the second printed circuit board 8 in alternating sequence.

What is claimed is:

1. An automation field device comprising:
    a housing having a passage; and
    a modular field device electronics unit disposed within the housing, the electronics unit including:
        a first printed circuit board having a first connector embodied to transmit energy and data and to connect electrically to a peripheral unit, and a second connector embodied to transmit energy and data, wherein the first connector and the second connector are disposed on the first circuit board such that each connector is enabled to be mated from a same direction,
        a second printed circuit board having a third connector embodied to transmit energy and data and to be complementary to the second connector and an opening, wherein:
    the first circuit board and the second circuit board are embodied to be detachably connectable with each other,
    the second connector and the third connector are disposed such that they couple with each other when the first circuit board is connected to the second circuit board,
    the first circuit board is embodied to pass energy and data signals from the first connector to the third connector via the second connector when the first circuit board is connected to the second circuit board, and
    the opening is embodied to permit access to the first connector when the first circuit board is connected to the second circuit board.

2. The field device according to claim 1, the first circuit board further having a fourth connector embodied to transmit energy and data, the fourth connector disposed on the first circuit board such that the fourth connector is enabled to be contacted from the same direction in which the first connector and the second connector are contacted.

3. The field device according to claim 2, wherein the fourth connector is connected via at least one gas-filled tube or gas arrestor to the first connector.

4. The field device according to claim 2, the second printed circuit board further having a fifth connector having contact pins, the fifth connector embodied to transmit energy and data and to be complementary to the fourth connector, the fifth connector disposed on the same side of the printed circuit board as the third connector, wherein the contact pins of the fifth connector are connected to ground.

5. The field device according to claim 4, the second printed circuit board further having
additional third connectors,
additional fifth connectors, and
additional openings, wherein the additional third connectors are embodied to permit additional first circuit boards to be connected with the second circuit board, the additional openings are embodied to permit access to the first connectors of the connected first circuit boards, and the contact pins of the fifth plug connectors are connected to ground.

6. The field device according to claim 5, the second circuit board further having an internal bus that electrically connects all third plug-in connectors to each other.

7. The field device according to claim 1, wherein the second plug-in connector is embodied according to a bus specification.

8. The field device according to claim 5, wherein the third connectors and the fifth connectors are disposed in an alternating sequence on the second printed circuit board.

9. The field device according to claim 2, wherein the first, second, and fourth connectors of the first circuit board are disposed on a same printed circuit board edge or side.

10. The field device according to claim 1, wherein the first circuit board and second circuit board are disposed relative to each other such that a surface plane of the first printed circuit board intersects with a surface plane of the second printed circuit board.

11. The field device according to claim 1, wherein the peripheral unit is disposed outside of the housing and a lead is electrically connected to the first connector, passes through the opening or passage and is electrically connected to the peripheral unit.

12. The field device according to claim 7, wherein the bus specification is the CAN bus specification.

* * * * *